United States Patent [19]

Braun et al.

[11] 4,209,848
[45] Jun. 24, 1980

[54] MAGNETIC DOMAIN DEVICE SHIELD

[75] Inventors: Roland J. Braun, Vestal; Gary R. Carden, Binghamton, both of N.Y.

[73] Assignee: International Business Machines Corporation, Armonk, N.Y.

[21] Appl. No.: 916,188

[22] Filed: Jun. 16, 1978

[51] Int. Cl.² .................... G11C 19/08; G11C 5/04
[52] U.S. Cl. .............................................. 365/2; 365/53
[58] Field of Search ................................ 365/2, 53

[56] References Cited

U.S. PATENT DOCUMENTS

| | | | |
|---|---|---|---|
| 4,096,581 | 6/1978 | Carlo et al. | 365/2 |
| 4,101,970 | 7/1978 | Saito et al. | 365/2 |

OTHER PUBLICATIONS

IEEE Transactions on Magnetics–vol. Mag-9, No. 3, Sep. 1973, pp. 429-433.

IBM Technical Disclosure Bulletin–vol. 20, No. 8, Jan. 1978, pp. 3054-3055.

*Primary Examiner*—James W. Moffitt
*Attorney, Agent, or Firm*—Norman R. Bardales

[57] ABSTRACT

Field accessed magnetic domain device apparatus, of the kind which employs an inner and an encompassing outer solenoid as the rotational magnetic field orthogonal drive coil members with the magnetic domain device(s) mounted within the inner solenoid, has conductive shield means disposed within the inner solenoid between the device(s) and the solenoids. This results in a substantially uniform flux distribution which passes through the inner solenoid and/or mitigation of the adverse effects of the stray flux between turns of the solenoids. As a consequence, a substantially uniform rotational magnetic field distribution is provided in the active area for the device(s), generally referred to as magnetic bubble device(s) or chip(s).

7 Claims, 8 Drawing Figures

MAGNETIC DOMAIN DEVICE SHIELD

BACKGROUND OF THE INVENTION

1. Field of the Invention

This invention is related to magnetic domain device apparatus and, more particularly, to improvements for providing a substantial uniform rotational magnetic field distribution for such apparatus.

2. Description of the Prior Art

It is well known that the rotational magnetic field distribution, in the absence of any compensation, generated by the two orthogonal magnetic field drive coils for a magnetic domain device has a peak distribution which has a maximum at the center of the coils and minima at its edges.

One prior art solution for obtaining a uniform rotational magnetic field distribution is to provide a varied separation between adjacent turns of the solenoid in lieu of providing a uniform separation. Thus, for example, in U.S. Pat. No. 4,045,786, the spacing between adjacent turns of the printed circuit encompassing orthogonal solenoid system disclosed therein is gradually decreased proceeding from the center of the particular solenoid to its edges. As is obvious, such prior art systems require careful control to effect the required variable and symmetrical spacing between turns. Moreover, where the solenoids are of the discrete wire wound type, effecting and maintaining the desired variable and symmetrical spacing between turns is even more complex. Furthermore, the variable spacing itself could be a potential source of ripple in the rotational field uniformity.

In the publication entitled "Double Stacked Bubble Memory Module", D. G. McBride, IBM Technical Disclosure Bulletin, Vol. 20, No. 8, January 1978, pp. 3054–3055, it refers to and discusses ripple in the rotational field uniformity caused by spacings between turns of the solenoids of an encompassing orthogonal solenoid system of a first described therein bubble memory package structure. Briefly, the structure includes a planar rectangular substrate on one side of which are mounted the chips and on the other side of which a plurality of input/output terminal pins are extended outwardly normal thereto. More spcifically, the pins are arranged in double parallel rows along each of the four edges of the substrate, with the pins of parallel rows being in columnar alignment. In this structure, the turns of the inner solenoid is wrapped around the chip mounted substrate about two of its parallel edges in the gaps between the columns of aligned pins located along these last two mentioned edges. As a result, the adjacent turns of each solenoid which are wrapped in the gaps have a close normal spacing, whereas the adjacent turns of either solenoid which are wrapped on each side of a column of aligned pins have a much larger spacing. It is this last mentioned spacing that results in the aforementioned ripple.

The publication further describes another structure which overcomes this ripple effect. This other structure has two separate pinned rectangular structures. Each substrate is pinned only along two parallel edges. The chips are mounted on one of the substrates and the inner solenoid is wrapped along its non-pinned parallel edges. Thereafter, the so wrapped substrate is mounted, i.e. stacked, with its pins facing the non-pinned side of the other substrate which carries thereon a pattern of terminal pads in register with the facing pins of the first substrate. The facing pins and pads are bonded together. The terminal pads are interconnected in turn with the heads of the pins carried by the aforementioned other substrate. The outer solenoid is then wrapped over the stacked assembly so that it passes about the non-pinned edges of the solenoid substrate which are orthogonal to the non-pinned edges of the first substrate. As a result, the turns of both of the orthogonal windings of the second structure described in the publication are wrapped with a uniform spacing and without the necessity of passing between pins as in the first described structure of the publication. However, because of the stacking of the substrates, the structure is bulky and complex, and, furthermore, is subject to the aforementioned rotational magnetic field peak distribution which in turn limits the effective active region in which the chips can be mounted.

It has also been suggested that an auxiliary peripheral compensating coil be provided to compensate for the peak distribution of the rotational magnetic field. However, this has the disadvantage of substantially increasing the height of the magnetic domain device apparatus and/or of increasing the power consumption.

It should be understood that it is also known in the prior art to compensate for non-uniformities in the bias magnetic field which are generally produced by the permanent magnet system associated with magnetic bubble devices and which maintain the magnetic domains of the devices. This type of compensation is generally accomplished with additional permanent magnets or high-permeability plates and, as such, are limited to the control of the bias field distribution per se, but not the rotational field distribution, cf. U.S. Pat. Nos. 3,927,397 and 4,068,219, for example.

It should be understood that there are other prior art orthogonal coil systems which are not of the encompassing type. One such prior art system uses two pairs of orthogonal flat coils so that the chips are sandwiched between the two pairs. Another such non-encompassing prior art system, referred to as a reflection coil system, uses a single pair of orthogonal flat coils located on one side of the chips and a coacting single reflective conductive plate located on the other side of the chips, thereby eliminating one of the pairs of orthogonal coils of the aforedescribed two pair system, cf. the publication entitled "Reflection Coil Packaging For Bubble Devices", Masaki Takasu et al, IEEE Trans. On Magnetics, Mag. 11, No. 5, Sept. 1975, pages 1151–1153. In U.S. Pat. No. 4,027,300, entitled "Bubble Memory Package", R. J. Braun, coinventor herein, and assigned to the present assignee hereof, another reflective coil system is described which uses a single pair of orthogonal coils and a pair of reflective conductive plates, one for each coil. The chips are sandwiched between the two plates. The two plates in turn are sandwiched between the two coils. Each coil coacts with plates located on the opposite side of the chips. However, the plates must be orthogonally slotted so that the flux from the particular coil can be channeled through the slots of the adjacent plate and thus coacts with the other plate located on the opposite side of the chips. The aforesaid patent describes non-encompassing systems of the flat coil and solenoid types. It should be noted that non-encompassing systems do not have inner and outer, i.e. encompassing, solenoids per se, and/or chips mounted within any of the coils. Moreover, in the case of prior art reflective coil systems, the reflective conductive plate does not and cannot provide a shield for the flux passing within the center of the coil and, consequently, does not and cannot overcome the problems associated with an encompassing coil system and particularly where the chips are mounted within the inner coil of such an encompassing coil system.

SUMMARY OF THE INVENTION

It is an object of this invention to provide bubble domain device apparatus of the encompassing solenoid field coil system kind with an improved uniform rotational magnetic field distribution.

It is another object of this invention to provide bubble domain device apparatus of the aforementioned kind which is less bulky and more compact, and has reduced power consumption.

Still another object of this invention is to provide bubble domain device apparatus of the aforementioned kind which reduces and/or mitigates ripple in the rotational field uniformity.

The foregoing and other objects, features and advantages of the invention will be apparent from the following more particular description of preferred embodiments of the invention, as illustrated in the accompanying drawing.

According to one aspect of the invention, in field accessed magnetic domain device apparatus there is provided the combination having a pair of orthogonal first and second magnetic field coil members. Each of the members are of the solenoid type and have plural turns, the first member being disposed within the second member. At least one magnetic domain device is disposed within the first member. Conductive shield means are disposed within the first member for the flux being provided by the magnetic field coil members and passing through the inner member to provide a substantial uniform flux distribution therein, i.e. within the first member.

The foregoing and other objects, features and advantages of the invention will be apparent from the following more particular description of preferred embodiments of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENTS

Figure 1:
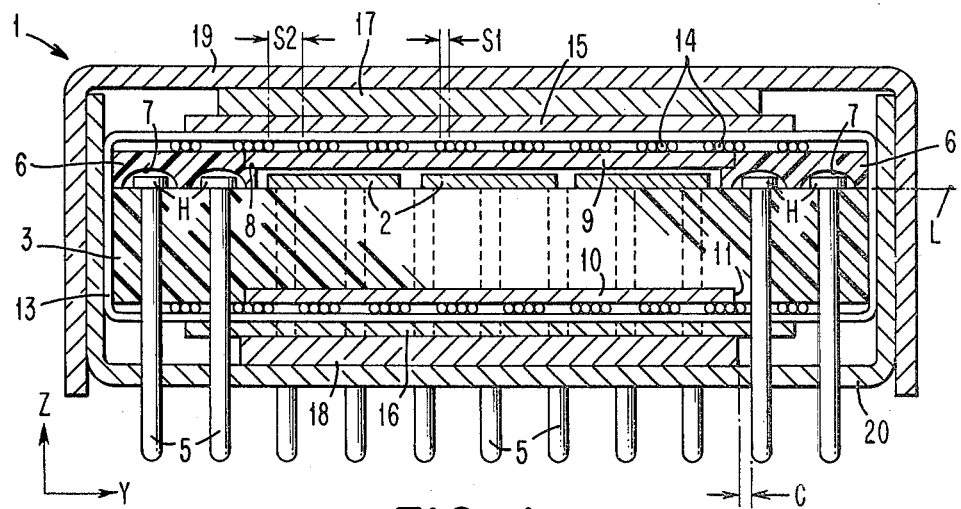
FIG. 1 is a cross-sectional view of a preferred embodiment of the field-accessed magnetic domain device apparatus of the present invention.
Figure 2:
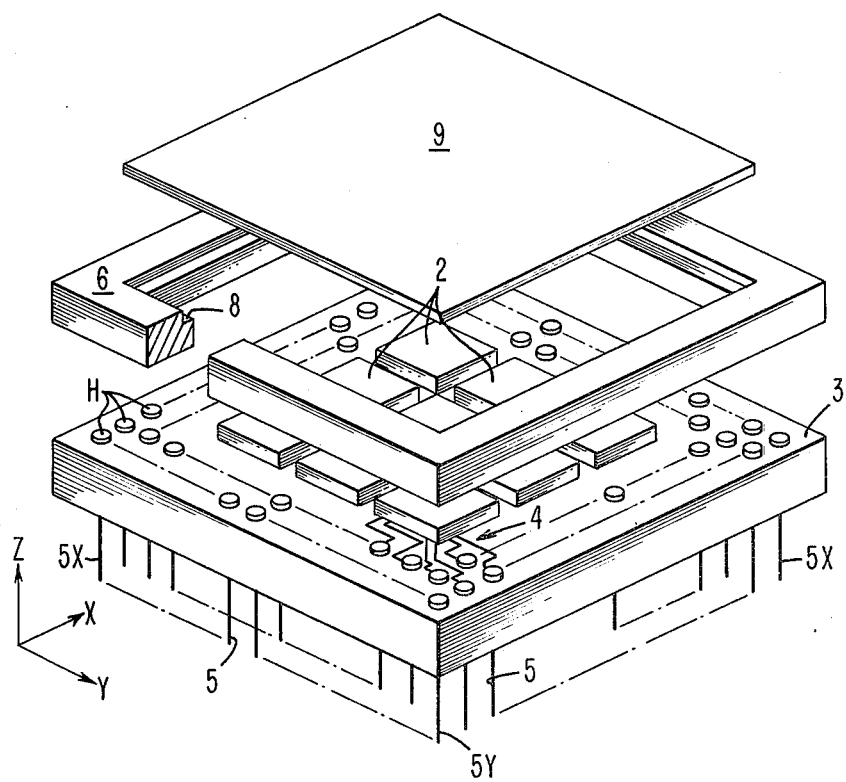
FIG. 2 is a perspective and exploded view of a partial assembly of the apparatus of FIG. 1.
Figure 3:
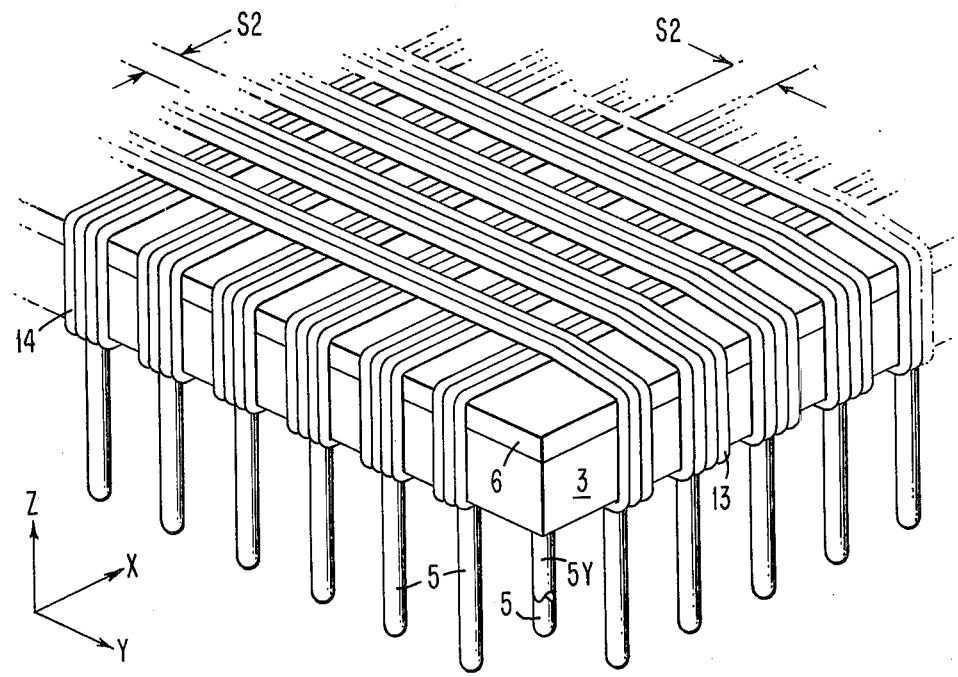
FIG. 3 is a perspective partial view of a schematically shown partial assembly of the apparatus of FIG. 1 with the rotational field coil solenoids assembled thereto.

Referring now to FIGS. 1-3, field accessed magnetic domain device apparatus is generally indicated by the reference numeral 1, FIG. 1. By way of example, apparatus 1 has a single level L of plural magnetic domain device chips 2 commonly referred to as magnetic bubble chips. More particularly, as shown in greater detail in FIG. 2, chips 2 are arranged in a three-by-three array. Chips 2 are mounted on the upper surface of the rectangularly and preferably square shown planar ceramic substrate member 3. The upper surface of member 3 is circuitized with a printed circuit conductor pattern 4, partially shown in FIG. 2, for sake of clarity. The terminal pads, not shown, of chips 2, which are located on the respective undersurfaces of chips 2, are bonded to corresponding terminal pads of the conductors of pattern 4. The conductors, in turn, of pattern 4 are terminated and are hence electrically connected to appropriate ones of the heads H of the four double parallel rows of aligned terminal pins 5 which are affixed normal therethrough. The four double rows of pins 5 are symmetrically arranged in two concentric square patterns such that there is one of the four double rows located along each edge of the periphery of square substrate 3. By way of example, apparatus 1 has a total of seventy-two pins 5, with forty pins 5 arranged in the outer square pattern and thirty-two in the inner square pattern. The pins 5 of parallel rows are in columnar alignment.

An insulating ring-like spacer member 6, which has compatible X, Y dimensions as the corresponding dimensions of member 3, is aligned and located on the upper surface of member 3. Member 6 is provided with appropriate registered recesses 7 for heads H which thereby allows members 3 and 6 to be flush mounted with respect to each other. A shelf-like recess 8 is provided around the inner walls of member 6. A thin planar electrically conductive non-magnetic member 9, preferably copper, is supported by the shelf-like recess 8. The respective upper outer planar surfaces of members 6 and 9 are substantially co-planar. In the preferred embodiment, another conductive non-magnetic, preferably copper, member 10 of substantially the same dimensions of member 9 is located in a recess 11 formed centrally and inwardly on the bottom surface of member 3. The lower outer planar surfaces of members 3 and 10 are substantially co-planar and members 9 and 10 have substantially the same planar configuration and are in co-alignment with each other as shown in FIG. 1.

The assembly of FIG. 2 thus has a compact box-like configuration, cf. FIGS. 1 and 3, but it should be understood, is shown in exploded view in FIG. 2, for sake of clarity.

As shown in FIG. 1 and in greater detail in FIG. 3, apparatus 1 has an encompassing type rotational magnetic field drive coil system for the chips 2, to wit: orthogonal solenoids 13, 14. Inner coil 14 is, for example, the Y coil and is formed by wrapping turns of an insulated wire conductor about the assembly of FIG. 2 along its two opposing parallel edges which are parallel to the reference axis Y. As a result, adjacent turns of coil 14 are provided in the gaps between the columns of aligned pins 5 which are located in the four parallel rows of pins 5, i.e. the two double rows, along the last mentioned two edges of the assembly of FIG. 2. For the particular example previously mentioned for the arrangement of pins 5, coil 14 has ten groups or channels of a plural number of turns in each group. The center-to-center spacing S1 between adjacent turns of a group is uniform and the center-to-center spacing S2, which is caused by the presence of pins 5, between adjacent turns of two adjacent groups is also uniform but much larger than S1 due to the relative dimensions of the conductor diameter of coil 14 and its insulative thickness, and the diameter of the pins 5.

In a similar manner, the encompassing X coil 13 is formed by wrapping an insulated wire conductor around the inner Y coil 14 in an orthogonal direction. Thus, coil 13 is wound about the two opposite parallel edges of the assembly of FIG. 2 and coil 14, which last mentioned edges are parallel to the reference axis X. As a result, adjacent turns of coil 13 are provided in the gaps between the columns of aligned pins 5 which are located in the four parallel rows of pins 5, i.e. the two double rows, along the last mentioned two edges. Thus, coil 13 likewise has ten groups or channels of a plural number of turns in each group and has corresponding similar spacings S1 and S2 for the turns as those of the inner coil 14. The ends of coils 13, 14 are connected to the respective two pairs of outer row diametric corner pins 5, designated 5X and 5Y for sake of clarity.

Juxtaposed on each side of the outer field coils 13 are a pair of high-permeability magnetic planar plates 15, 16. Lower plate 16 is provided with insulated apertures for passage of the inner row of pins 5 therethrough. A pair of permanent magnetic plates 17, 18 in turn are superimposed over members 15, 16, respectively. The dimension of member 18 is such that there is sufficient clearance C between it and the inner row of pins 5.

The entire assembly 2–18 is housed in a two-part housing 19, 20, which is made of a high-permeability magnetic material. Lower part 20 is generally box-shaped with four vertical sides and one bottom wall, the latter having insulated openings for the passage of the pins 5 therethrough. Cover part 19 is also box-shaped with a top and four vertical side walls and fits over the side walls of part 20. A suitable sealant may be used to seal the assembly of FIG. 1.

The magnetic bias field maintains stable bubbles of a certain size in the magnetic bubble material of the devices 2 as is well known to those skilled in the art. The permanent magnetic bias assures the basic non-volatility of the devices 2 in the bias field which thereafter acts and reacts under the influence of the rotational magnetic field generated by the orthogonal field coils 13, 14 operating in concert. The particular bias magnetic structure of apparatus 1 is referred to in the art as a closed field structure and includes the permanent magnet plate members 17, 18 and high-permeability members 15, 16, 19, 20.

As is well known to those skilled in the art, the rotational magnetic field that is generated by coils 13, 14 propagates the bubbles through the bubble material of the devices 2. In order to understand the principles of the present invention, the following explanation will now be made with reference to FIGS. 4–7.

Figure 4:
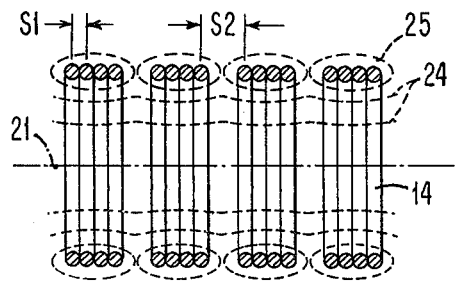
FIGS. 4 and 5 are schematic partial cross-sectional views illustrating the flux distributions within an inner solenoid member with and without, respectively, the conductive shield members of the present invention, respectively.
Figure 6:
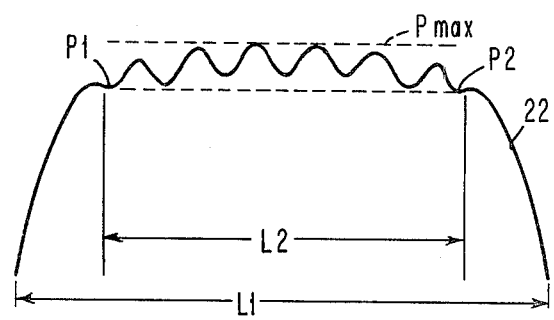
FIGS. 6 and 7 are idealized waveforms illustrating the rotational magnetic field component produced by the inner coil with and without, respectively, the conductive shield members of the present invention.
Figure 5:
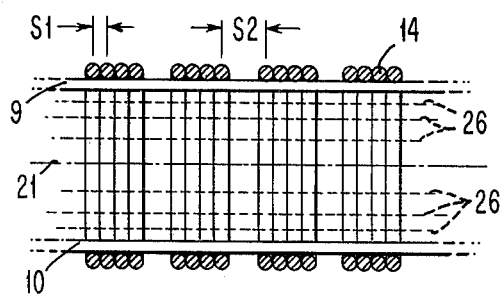
Figure 7:
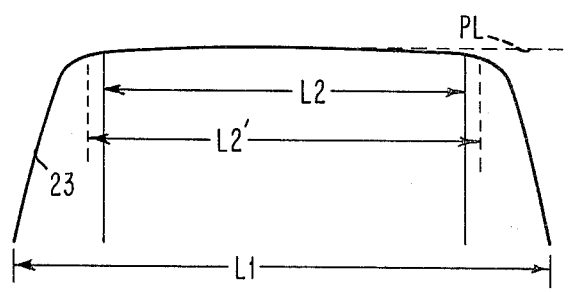

In FIGS. 4 and 5, there is partially shown a cross-sectional view of the inner coil 14 taken along its longitudinal center axis 21, which is transverse to its turns. For comparison and explanation purposes, the conductive shield means of the present invention are absent and present, respectively, in FIGS. 4 and 5. FIGS. 6 and 7 are idealized waveform diagrams of the rotational magnetic field component produced by coil 14 plotted as field intensity versus overall length L1 of coil 14 along its axis 21 for the conditions of FIGS. 4 and 5, respectively. It should be noted that for the condition of FIG. 4, with absence of the shield means of the present invention, which in the preferred embodiment are the two conductive plates 9, 10, the corresponding distribution curve 22 of FIG. 6 has a maximum peak P max and two minima levels P1, P2 within a certain active region area for mounting the devices 2 which is represented by the linear dimension L2 of the aforesaid area that is parallel to axis 21. However, as shown by curve 23 of FIG. 7, when the shield means 9, 10 are within the coil 14, the rotational magnetic field distribution within coil 14 has a more uniform level PL over the same corresponding area as represented by dimension L2. Moreover, for a fixed length L1 of coil 14, the active region area for mounting the devices 2 actually increases as shown by the dimension level L2' and, hence, increases the number of devices 2 which can be placed within the coil 14.

Moreover, as shown in FIG. 4, the flux distribution within the coil 14, when shield members 9, 10 are not in coil 14, is distorted as indicated by the wavy lines 24. This is due to the influence of the stray flux between adjacent turns of the coil 14 associated with the spacings S1 and S2, e.g. stray flux 25. As a result, a ripple distortion is superimposed on the rotational field distribution of coil 14 as shown by the undulations in waveform 22 of FIG. 6. However, when the shield means 9, 10 is in the coil 14 the influence of the stray flux is mitigated and, hence, its effect, and thus the flux distribution within coil 14, is substantially uniform as indicated by the parallel lines 26 of FIG. 5. As a result, the rotational magnetic field distribution, cf. curve 23, FIG. 7, is substantially free from ripple effects.

A similar uniform rotational field distribution and mitigation of the ripple effect caused by the spacings S1, S2 of outer coil 13 takes place within the inner coil 14 in the orthogonal direction when the shield means 9, 10 are in the coil 14.

It should be readily apparent from FIGS. 4 and 5 to those skilled in the art that with the presence of shield means 9, 10, the positioning of the chip mounting level L within coil 14 is not as critical as in the case where the shield means 9, 10 are not present. That is to say, there is greater tolerance in mounting the chips 2 within the coil 14 with respect to the reference axes X, Y, and Z with the shield means 9, 10 of the present invention. Preferably, the shield members 9, 10 are thin members such as foil, e.g. 0.1 millimeters thick approximately. Moreover, it should be understood that in certain applications where a certain amount of non-uniformity and/or distortion is allowable or not as critical, only one of the shield members 9, 10, and preferably the one closest to the active area for devices 2, e.g. member 9, may be used. Preferably, each of plates 9, 10 have side dimensions which are approximately fifteen to twenty-five percent longer than the corresponding side dimensions of the active region or area and can be fifteen to twenty percent less than the length L1 of the inner coil 14.

Figure 8:
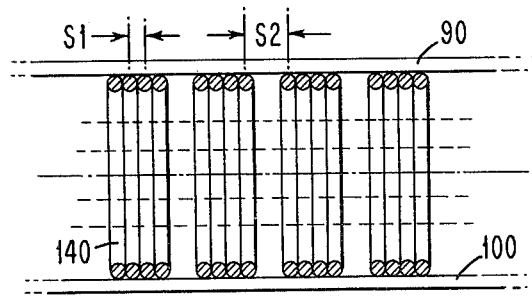
FIG. 8 is a schematic partial cross-sectional view illustrating another embodiment of the shield means of the present invention and the flux distribution within the inner solenoid member thereof.

In still other embodiments of the present invention, the shield means may be juxtaposed on the outside of the inner coil, either between the two coils or on the outside of the outer coil. Thus, for example as shown in FIG. 8, the two planar shield members 90, 100 are disposed on the outside of inner coil 140, i.e. between the inner coil 140 and outer coil, not shown for sake of clarity. However, the shielding provided by the members 90 and 100, either between the two coils or on the outside of outer coil, is not as effective as the embodiment of FIGS. 1–3 and 5.

Other modifications to the apparatus of the present invention will be apparent to those skilled in the art. For example, plural levels L of devices 2 may be mounted within the coil 14 with the shield means preferably disposed between the inner coil 14 and the devices 2. Also, coils 13, 14 may be configured as an encompassing system of the printed circuit solenoid types.

Thus, while the invention has been particularly shown and described with reference to preferred embodiments thereof, it will be understood by those skilled in the art that various changes in form and details may be made therein without departing from the spirit and scope of the invention.

We claim:

1. In field accessed magnetic domain device apparatus, the combination comprising:
    a pair of orthogonal first and second rotational magnetic field coil members, each of said members being of the solenoid type and having a plurality of turns, said first member being disposed within said second member,
    at least one magnetic domain device disposed within said first member in a predetermined region thereof; and
    conductive shield means juxtaposed to a predetermined one of said coil members for the flux provided by said magnetic field coil members and passing through said first member to provide a substantially uniform flux distribution over said predetermined region, the perimeter of said shield means being confined within the perimeter of each of said coil members.

2. Apparatus according to claim 1, wherein said conductive shield means comprises a pair of first and second planar members, said devices being disposed between said first and second planar members.

3. In field accessed magnetic domain device apparatus, the combination comprising:
    a pair of orthogonal first and second rotational magnetic field coil members, each of said members being of the solenoid type and having a plurality of turns, said first member being disposed within said second member, said turns of each of said coil members being arranged in spaced groups of plural turns,
    at least one magnetic domain device disposed within said first member in a predetermined region thereof; and
    conductive shield means disposed within said first member for the flux provided by said magnetic field coil members and passing through said first member to provide a substantially uniform flux distortion over said predetermined region, the perimeter of said shield means being confined within the perimeter of each of said coil members.

4. Apparatus according to claim 3, wherein said conductive shield means comprises a pair of first and second planar members, said devices being disposed between said first and second planar members.

5. In field accessed magnetic domain device apparatus, the combination comprising:
    a retangular planar substrate having first andsecond opposite surfaces and four peripheral edges,
    a plurality of conductive terminal pins carried by said substrate along each of said peripheral edges thereof, said pins being extended outwardly normal from said second surface,
    a printed circuit pattern disposed on said first surface and having means for selectively connecting said pattern to said pins,
    a predetermined number of magnet domain devices mountably connected to said circuit pattern within a predetermined region,
    a pair of orthogonal first inner and second outer magnetic rotation field coil solenoids, each of said solenoids having a plurality of turns, said turns of said first inner solenoid being disposed about said substrate and said predetermined number of devices along two parallel said edges of said substrate and between said pins of said two parallel edges, said turns of said second outer solenoid being orthogonally disposed about said first inner solenoid having said substrate and said predetermined number of devices therein, said turns of said second outer solenoid further being disposed along the other two parallel said edges of said substrate and between said pins of said other two parallel edges, and
    planar conductive non-magnetic shield means disposed within said first solenoid for the flux provided by said first and second solenoids and passing through said first solenoid to provide a substantially uniform flux distribution over said predetermined region, the perimeter of said shield means being confined within the perimeter of each of said coil members and extended past the perimeter of said predetermined region.

6. Apparatus according to claim 5, wherein said conductive shield means further comprises first and second thin planar members, said predetermined number of devices being disposed between said first and second planar members.

7. Apparatus according to claim 5, wherein said combination is enclosed in a permanent magnet bias structure, with said terminal pins being extended outwardly therefrom.

* * * * *